(12) United States Patent
Huang et al.

(10) Patent No.: US 11,038,010 B2
(45) Date of Patent: Jun. 15, 2021

(54) CAPACITOR STRUCTURE AND METHOD OF MAKING THE SAME

(71) Applicant: TAIWAN SEMICONDUCTOR MANUFACTURING CO., LTD., Hsinchu (TW)

(72) Inventors: Jian-Shiou Huang, Fangliao Township (TW); Chia-Shiung Tsai, Hsin-Chu (TW); Cheng-Yuan Tsai, Chu Pei (TW); Hsing-Lien Lin, Hsin-Chu (TW); Yao-Wen Chang, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/609,159

(22) Filed: Jan. 29, 2015

(65) Prior Publication Data

US 2016/0225844 A1 Aug. 4, 2016

(51) Int. Cl.
*H01L 49/02* (2006.01)
*H01L 21/02* (2006.01)

(52) U.S. Cl.
CPC ........ *H01L 28/75* (2013.01); *H01L 21/02247* (2013.01); *H01L 21/02249* (2013.01); *H01L 28/40* (2013.01); *H01L 2924/1205* (2013.01)

(58) Field of Classification Search
CPC ... H01L 21/28568; H01L 28/75; H01L 28/40; H01L 28/55; H01L 28/56; H01L 28/57; H01L 28/60; H01L 2924/1205; H01L 21/02247; H01L 21/02249
See application file for complete search history.

(56) References Cited

U.S. PATENT DOCUMENTS

| 5,406,447 A * | 4/1995 | Miyazaki | H01L 28/60 257/535 |
| 6,320,244 B1 * | 11/2001 | Alers | H01L 27/1085 257/532 |
| 6,426,249 B1 * | 7/2002 | Geffken | H01L 28/55 257/E21.009 |
| 2003/0008455 A1 * | 1/2003 | Kim | H01L 21/28556 438/240 |
| 2005/0062130 A1 * | 3/2005 | Ciancio | H01L 23/5223 257/532 |

(Continued)

FOREIGN PATENT DOCUMENTS

KR 20000053454 8/2000

OTHER PUBLICATIONS

Effects of Copper Contamination in Silicon on Thin Oxide Breakdown (Deepak A. Ramappa et al., Journal of the Electrochemical Society, 146 (6) 2258-2260 (1999)).

(Continued)

*Primary Examiner* — Kenneth Parker
*Assistant Examiner* — John Lin
(74) *Attorney, Agent, or Firm* — Cooper Legal Group, LLC (57) ABSTRACT

A structure includes a semiconductor substrate, a conductor-insulator-conductor capacitor. The conductor-insulator-conductor capacitor is disposed on the semiconductor substrate and includes a first conductor, a nitrogenous dielectric layer and a second conductor. The nitrogenous dielectric layer is disposed on the first conductor and the second conductor is disposed on the nitrogenous dielectric layer.

20 Claims, 8 Drawing Sheets

(56) References Cited

U.S. PATENT DOCUMENTS

| | | | | |
|---|---|---|---|---|
| 2006/0128127 | A1* | 6/2006 | Seo | C23C 16/34 438/584 |
| 2007/0222071 | A1* | 9/2007 | Moon | H01L 21/76843 257/736 |
| 2010/0090342 | A1* | 4/2010 | Chang | H01L 21/76844 257/751 |
| 2010/0117197 | A1* | 5/2010 | Cho | H01L 23/5223 257/532 |
| 2012/0133428 | A1* | 5/2012 | Forbes | C23C 16/308 327/581 |
| 2012/0313220 | A1* | 12/2012 | Yang | H01L 23/5228 257/537 |
| 2013/0094120 | A1* | 4/2013 | Sasajima | H01L 27/016 361/305 |

OTHER PUBLICATIONS

Improvement of Electrical Properties of MOCVD HfO2 by Multi-step Deposition (Chia Ching Yeo et al., Electrochemical and Solid-State Letters, 6 (11) F42-F44 (2003))

Amorphous metal electrodes could bring super-cheap electronics (E. Willian Cowell III et al., Nov. 8, 2010, Power. Electronic: http://powerelectronics.com/energy-harvesting/amorphous-metal-electrodes-could-bring-super-cheap-electronics).

The Evolution of Diffusion Barriers in Copper Metallization (Chiapyng Lee et al., Phase Studies in Electronic Materials, JOM, Jan. 2007)

Metal Nitride Diffusion Barriers for Copper Interconnects (Roy Adolfo Araujo, Ph. D. Dissertation, Electrical Engineering of Texas A&M University, Dec. 2008).

Copper-induced dielectric breakdown in silicon oxide deposited by plasma-enhanced chemical vapor deposition using trimethoxysilane (Ken-ichi Takeda et al., Journal of Applied Physics 94, 2572 (2003)).

\* cited by examiner

CAPACITOR STRUCTURE AND METHOD OF MAKING THE SAME

BACKGROUND

Capacitors are deployed in many different integrated circuit applications, and various types of capacitors such as metal-oxide-semiconductor (MOS) capacitor, PN junction capacitor, polysilicon-insulator-polysilicon (PIP) capacitor and metal-insulator-metal (MIM) capacitors are therefore developed to suit desired purpose.

Among the on-chip passive elements, MIM capacitors are often utilized in, for example, radio frequency integrated circuits (RFICs) due to lower electrode resistance, mixed signal (analog/digital circuits) applications, dynamic random access memory (DRAM), resistive random access memory (RRAM), logic operation circuits and diode. MIM are commonly used as decoupling capacitors to block power network noise. MIM capacitors have analog functions such as analog-to-digital conversions, filtering and termination of transmission lines. MIM also provides advantages over the other types of capacitors because of its frequency and temperature characteristics. In many telecommunication applications, in particular to handheld devices, low loss and relatively small temperature linearity are greatly desired. Conventional MIM capacitors include two electrodes and a dielectric layer sandwiched between the two electrodes to serve as an insulator. The capacitance, or amount of charge held by MIM capacitor per applied voltage, depends on certain factors, namely the area of the two electrodes and dielectric constant of the dielectric layer. A MIM capacitor is usually formed at the metal interconnect level, and some adverse effects, which are caused by poor mechanical or chemical stability of the metal, are seen.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The instant disclosure relates to a capacitor structure and method of making the same. Embodiments will be described with respect to a specific context, namely metal-insulator-metal (MIM) capacitors.

MIM capacitors are widely used in many integrated circuit applications, especially in high frequency telecommunication application such as cell phones and wireless devices. The capacitor is usually disposed at the outermost metal layers in an integrated circuit (e.g., between the M5 and M6 layers) so as to minimize parasitic capacitance effects caused by the underlying semiconductor substrate. Generally speaking, decoupling applications have lower requirement on leakage current, while analog applications require closer capacitor matching and relatively smooth voltage linearity. It is important to maintain the capacitance within a desired range, which fluctuates to a minor extent, so as to avoid device malfunction. Although the employment of copper (Cu) improves general circuit performance by a more desirable resistance and capacitance (RC) delay time, however, when a via hole is formed to connect a bottom interconnection with an upper interconnection, copper contamination and may be driven into MIM device while operating. These undesired copper atoms/particles migrate along grain boundaries, defects or pinholes, which can lead to problems in planarization and in a worse case reducing breakdown voltage.

More specifically, after copper atoms/particles are ionized by overcoming ionization energy, copper ions migrate to dielectric layer and pile up at the cathode surface. The aggregation of copper ions results in reduction of ionization energy threshold and an increase of potential. The copper ions then reduced to copper atom at the cathode, and the imbalance of ionization energy and potential further increases. Consequently, it leads to the tipping point of dielectric breakdown.

During etching, which can take place as early as at the M4 level, copper particles are introduced to plasma or atmosphere. When applying bias, copper atoms drift across the electrode and diffuse into the dielectric layer. The contamination of copper results in the reduction of dielectric breakdown voltage threshold as mentioned previously. A low dielectric breakdown voltage is strongly associated with device breakdown. A relatively low concentration, say 9E10 of copper atoms will be accompanied by early voltage breakdown. In addition, copper grain and pinholes are formed, which cannot be filled in by a subsequent via-hole-filling process. This type of early stage defect is often observed, and therefore it is important to minimize copper contamination in the etching process.

Figure 1:
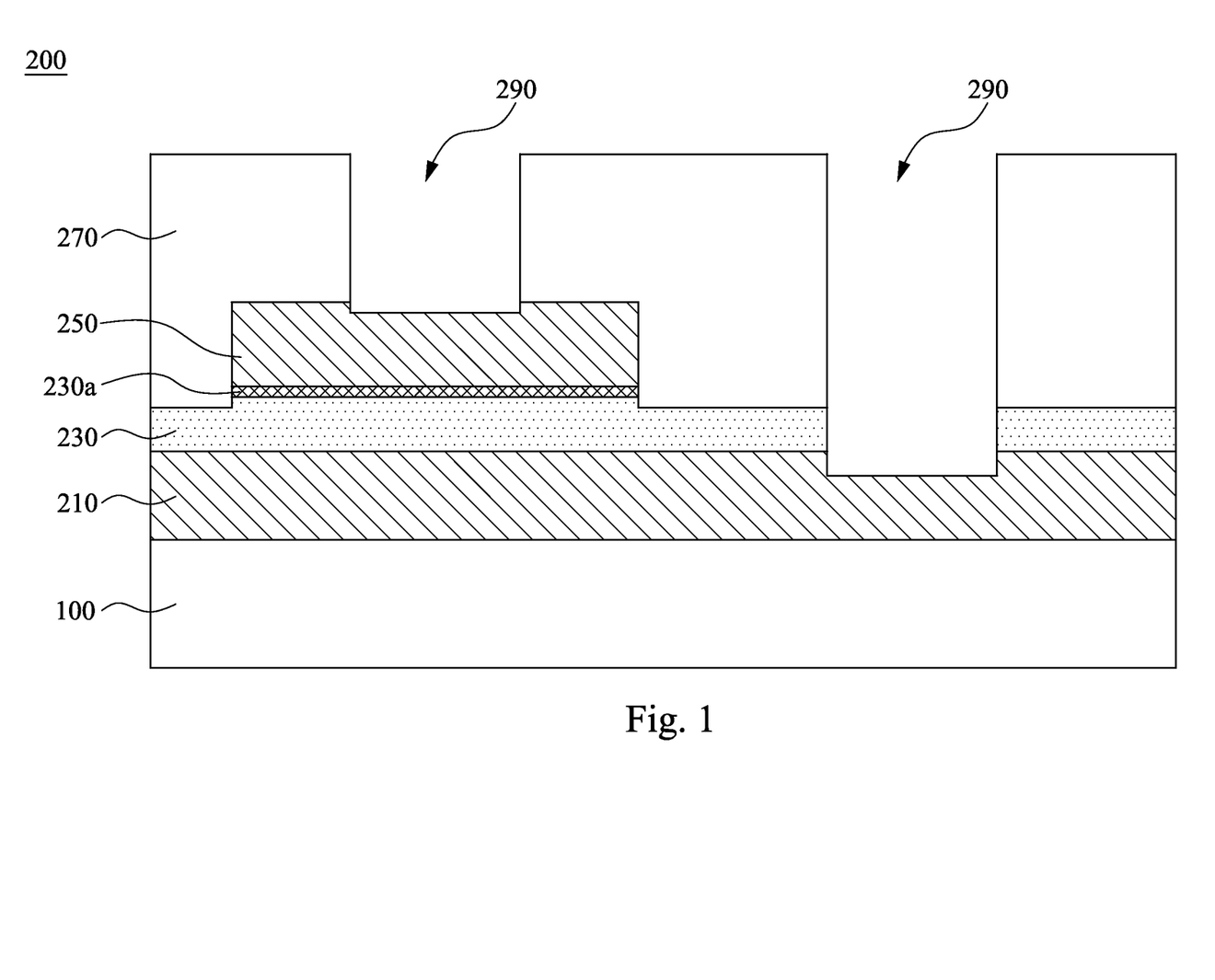
FIG. 1 is a cross-sectional view showing a nitrogenous metal-insulator-metal capacitor disposed on a semiconductor substrate in accordance with some embodiments.

Please refer to FIG. 1 showing a nitrogenous capacitor 200 in accordance with some embodiments of the instant disclosure. The nitrogenous capacitor 200 is disposed on a semiconductor substrate 100. The semiconductor substrate 100 has partially complete semiconductor circuits, such as modulation doped filed effect transistor (MODFET), metal-semiconductor field effect transistors (MESFETs) for high frequency applications or the like. The detail construction of the partially complete semiconductor substrate is not shown for the sake of clarity. The substrate is typically a silicon with various dielectric layers, which is often used in a Logic application, although the instant disclosure is applicable to other semiconductor substrates.

The nitrogenous capacitor 200 is disposed on the semiconductor substrate 100. As shown in FIG. 1, in some embodiments, the nitrogenous capacitor 200 includes a first conductor 210, and subsequently stacking a nitrogenous dielectric layer 230, a second conductor 250 and upper layers 270 thereon. The first and second conductors 210, 250 can be made of titanium nitride or the like. The first and second conductors may employ the same or different materials so as to provide desirable performance. The first conductor 210 is disposed on the semiconductor substrate 100. The nitrogenous dielectric layer 230 is disposed on the first conductor 210. More specifically, a surface of the dielectric layer 230 is treated by nitrogenous gas. This interface nitridation allows a portion of nitrogenous gas to spread over the dielectric layer 230 and more importantly to permeate a portion of the dielectric layer 230. The treatment results in a thin nitrogenous film 230a that occupies no more than 5 angstrom (Å) of the thickness of the dielectric layer 230, and at the same time, laminates the dielectric layer 230. In other words, the nitrogenous dielectric layer 230 contains a small amount of nitrogenous particles in a portion thereof.

A material for the dielectric layer 230 may include one or more oxide materials. Examples of suitable oxide materials include hafnium oxide, aluminum (II) oxide, tantalum oxide and zirconium oxide, or derivatives thereof or combination thereof. Other oxide materials include hafnium silicate, hafnium silicon oxynitride, lanthanum oxide, lanthanum silicate, zirconium silicate or combination thereof. Each of the one or more oxide materials may also be doped with a material selected from the group of titanium, zirconium or combination thereof. The nitrogenous gas is selected from the group of nitrogen ($N_2$), hydrogen nitride (ammonia, $NH_3$), nitrous oxide ($N_2O$) and the combination thereof.

The second conductor 250 is disposed on the nitrogenous dielectric layer 230. In the case of decoupling capacitor, subsequently, a silicon oxynitride layer is disposed on the second conductor 250, followed by a silicon nitride layer with oxide treatment disposed thereon. The capacitor is then patterned, and next a nitride layer fills in with an extremely low-k (ELK) dielectric layer finishing the top. A person of ordinary skill in the art should appreciate that stacking materials above the second conductor 250 may vary according to different requirement, and hereinafter they are collectively designated as upper layers 270 as shown in FIG. 1. Via-holes 290 are formed by conventional photolithographic techniques. The via holes 290 are etched for metal interconnections and exposing the first and second conductors 210, 250.

When performing etching to expose an underlying metal layer (e.g., M4), especially in Logic operation, copper particles are inevitably dispersed to plasma or atmosphere. In the presence of the nitrogenous layer 230, when applying bias, copper particles are less likely to diffuse across the thin nitrogenous film 230a through the via hole 290 at a decap area, therefore reducing the occurrence of pinhole or grain boundary formation. The thin nitrogenous film 230a prevents fast copper drifting to the cathode of the dielectric layer 230 so as to maintain a high breakdown voltage or other detects induced by copper contamination. In general, the introduction of the nitrogenous layer 230 attenuates copper-induced voltage breakdown.

Figure 2A:
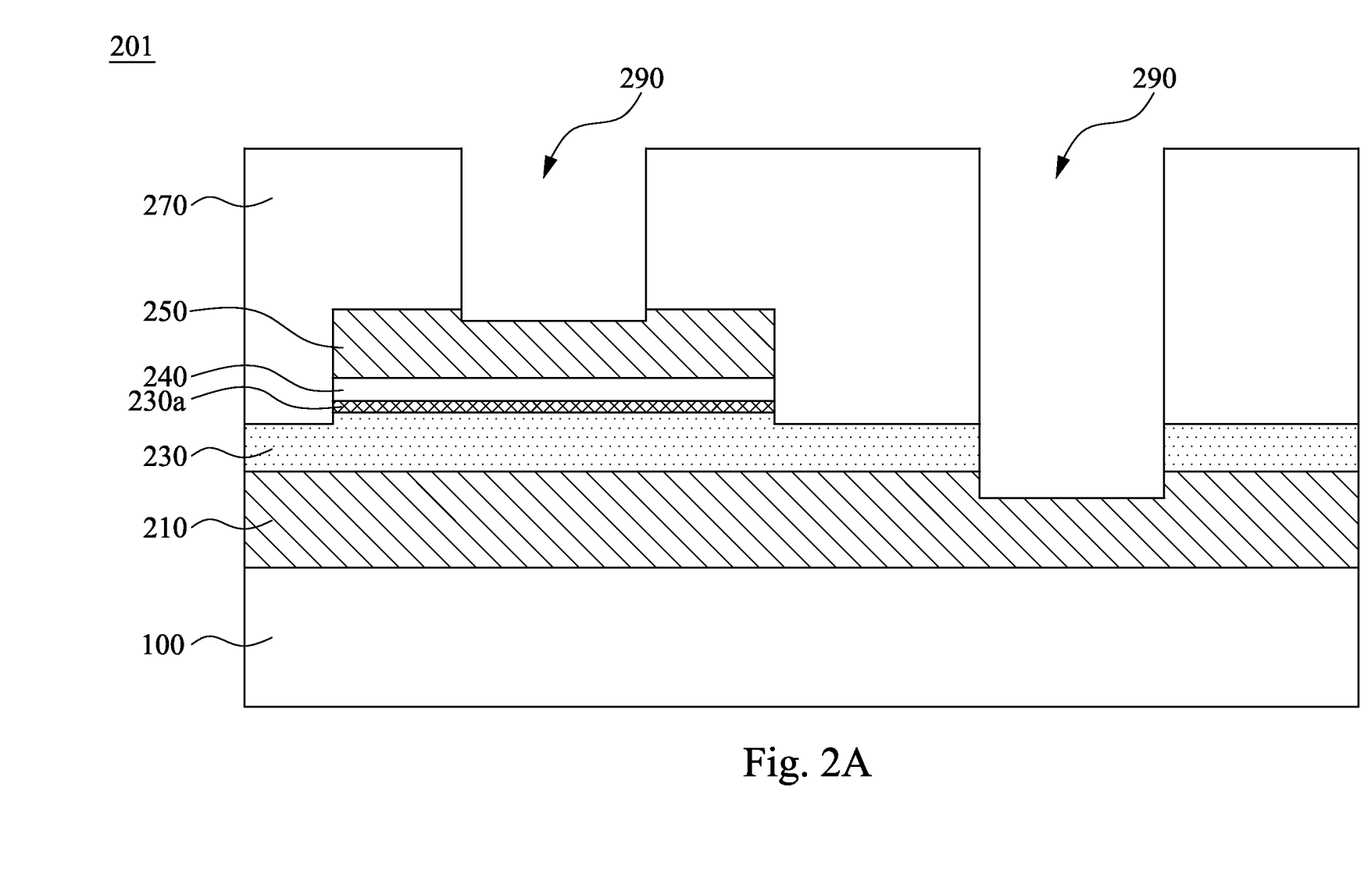
FIG. 2A is a cross-sectional view showing a nitrogenous metal-insulator-metal capacitor having a blocking layer in accordance with some embodiments of the instant disclosure.

Please refer to FIG. 2A showing a cross-sectional view of a nitrogenous metal-insulator-metal capacitor 201 having a blocking layer 240 in accordance with some embodiments of the instant disclosure. The nitrogenous MIM capacitor 201 is similar to the capacitor 200 as previously described, and the difference will be elaborated hereinafter to avoid repetition. In addition to the existing structure of the capacitor 200, the capacitor 201 further includes a blocking layer 240 disposed on the nitrogenous layer 230, sandwiched between the nitrogenous gas treated dielectric layer 230 and the second conductor 250. The blocking layer 240 may be formed of a single film of tantalum (Ta), tantalum nitride (TaN) or titanium nitride (TiN). Alternatively, the blocking layer 240 may be multilayered. In other words, the blocking layer 240 may constitute at least two blocking films. The multilayered blocking layer 240 may have stacks of blocking films made of Ta, TaN or TiN. It should be noted that a material of each of the blocking films is independently selected from the groups of Ta, TaN and TiN, and therefore the blocking layer 240 may have films made of different materials. For clarity, the multilayered blocking layer 240 is shown as a bulk block in FIG. 2A.

Figure 2B:
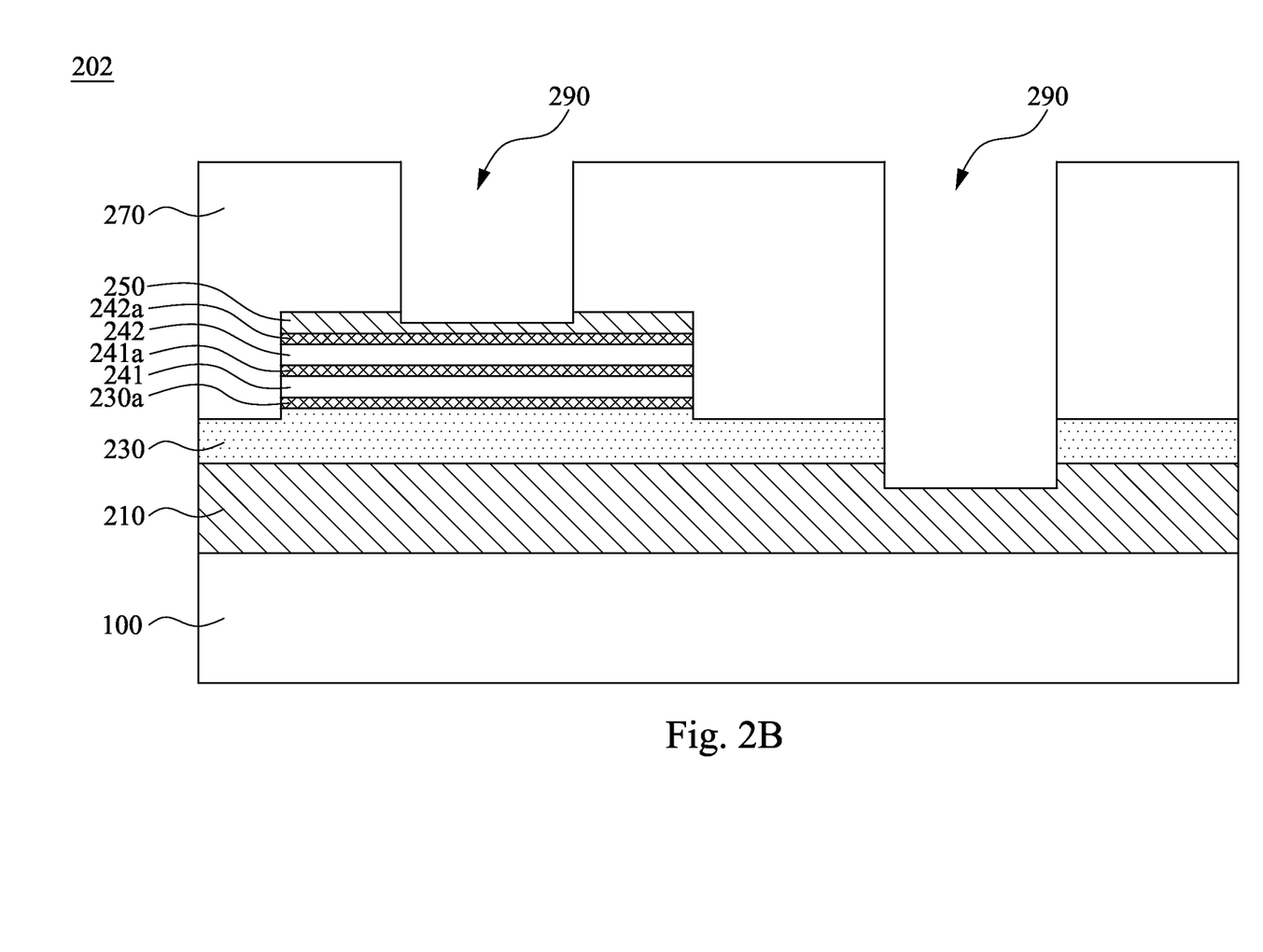
FIG. 2B is a cross-sectional view showing a nitrogenous metal-insulator-metal capacitor having a plurality of blocking layers in accordance with some embodiments of the instant disclosure.

In addition to the use of tantalum, tantalum nitride or titanium nitride as the blocking layer 240, FIG. 2B shows still another nitrogenous capacitor 202 in accordance with some embodiments of the instant disclosure. The difference between the capacitors 201 and 202 is described hereinafter. The nitrogenous capacitor 202 is similar to the capacitor 201, while the blocking layer 240 is in a different form. More specifically, the blocking layer 240 is formed with nitrogenous blocking films. As shown in FIG. 2B, the blocking layer 240 includes a first blocking film 241 and a second blocking film 242. Furthermore, each of the blocking film, namely the first blocking film 241 and the second blocking film 242, is treated by nitrogenous gas. Interface nitridation results in the nitrogen permeation at a surface of the first blocking film 241 and therefore a thin nitrogenous film 241a formed thereon. The second blocking film 242 is disposed on the nitrogenous first blocking film, and then, likewise, interface nitridation is conducted to have the same effect on a surface of the second blocking film 242. The blocking layer 240 ends up with a stack of multilayered blocking films, each of which is nitrogenous at the surface. Finally, the second conductor 250 and the upper layers 270 are disposed on the nitrogenous second blocking film 242 in succession. The combination of the blocking layer 240 and nitrogenous treatment allows an even more thorough protection against copper diffusion upon etching. That is to say, in addition to nitrogenous dielectric layer 230, which exhibits resistance to copper particle, the capacitor 202 further cuts down the tendency of copper accumulation by a plurality of nitrogenous blocking films. The multilayered blocking layer 240 minimizes copper crystallization because of, firstly, the materials used and secondly, the multilayered structure. The multilayered structure not only reinforces the blocking ability but also cuts short any potential defect development. Specifically, the blocking films slow down copper diffusion time-wise. Even if a pinhole or grain boundary is formed, its growth is interrupted because another blocking film makes a discrete interface of the blocking layer such that the fault is contained in a small dimension and a relatively small region. The overall result is that copper contamination is minimized and dielectric breakdown voltage can be maintained at a reasonable level.

It should be understood that the number of nitrogenous blocking films is not limited to two as shown in FIG. 2B. The blocking layer 240 may constitute a single layer or to a number of four, seven or above according to actual practice. The embodiments shown in FIGS. 2A and 2B do not intend to limit the scope of the instant disclosure.

Tantalum nitride has been proved by empirical study by R. A. Araujo for exhibiting property against copper diffusion to a great extent. As shown in Table 1, the impurity under detection was copper, and titanium nitride was used to protect materials from grain boundary formation under given dimension and temperature. The last column shows copper diffusion time once bias is applied to a 25 nm thickness substrate. The numbers in the last column was an estimate by equation processing. It can be seen from Table 1 that at 400-650° C., TiN can delay copper diffusion by 0.052 seconds. When it comes to TaN, the effectiveness grows a great deal to 20 thousand seconds, which is a significant increase compared to TiN.

TABLE 1

Diffusion of Copper through TiN or TaN

| Impurity | Nanocrystalline | Mechanism | $D_0$ [$cm^2s^{-1}$] | Temp. [° C.] | Time [s] |
|---|---|---|---|---|---|
| Cu | TiN | Grain Boundary | 6.0E−11 | 400-650 | 5.2E−02 |
| Cu | TaN | Grain Boundary | 1.6E−16 | 600-700 | 2.0E4 |

The blocking layer 240 may have a more specific material requirement along with special arrangement. In some embodiments, the capacitor 202 includes a plurality of first blocking films 241 and a plurality of second blocking films 242. More specifically, a material of the first blocking films 241 is titanium nitride. The plurality of first blocking films 241 is constructed by cycles of titanium nitride deposition, and each of the titanium nitride laminate is treated by nitrogenous gas. A material of the second blocking films 242 is tantalum nitride. Similarly, the second blocking films 242 are constructed by cycles of tantalum nitride deposition, and each of the tantalum nitride is treated by nitrogenous gas. The stacking of first blocking films 241, which is made of nitrogenous titanium nitride, is disposed on the nitrogenous dielectric layer 230. The stacking of second blocking films 242, which is made of nitrogenous tantalum nitride, is disposed on the first blocking films 241, proximate to the second conductor 250. The pile of second blocking films 242 has a collective thickness which is more than 5 angstroms (Å). If the thickness of the second blocking films 242 is less than 5 Å, the effectiveness of blocking copper diffusion may be compromised. This arrangement benefits the capacitor to maintain reasonable breakdown voltage, and at the same time the dielectric function is the least affected. The proximity of titanium nitride to the nitrogenous dielectric layer 230 ensures the performance of the capacitor because of similar material. The second blocking films 242, which employ tantalum nitride, can provide an even stronger barrier against copper diffusion as shown in Table 1. The plurality of blocking films creates a multi-interfaced, discrete blocking layer 240 so as to reduce copper contamination or copper-induced, low breakdown voltage.

Figure 3:
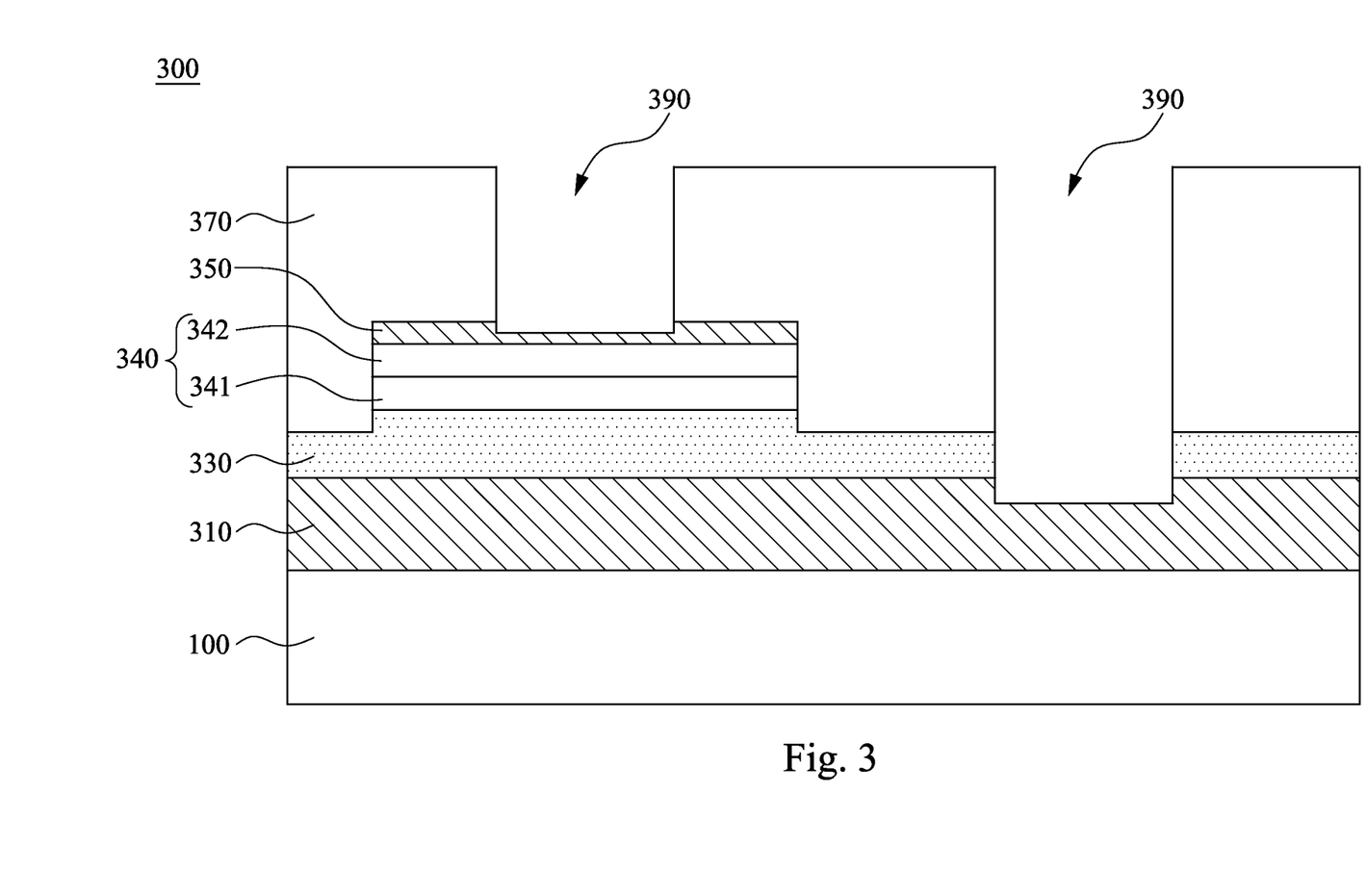
FIG. 3 is a cross-sectional view showing a metal-insulator-metal capacitor having a plurality of blocking layers in accordance with some embodiments of the instant disclosure.

In some embodiments in accordance with the instant disclosure, a MIM capacitor structure 300 is provided. Attention is now invited to FIG. 3. The structure 300 includes a semiconductor substrate 101, a first conductor 310, a dielectric layer 330, a multilayered blocking layer 340, a second conductor 350 and upper layers 370. The first conductor 310 is disposed on the semiconductor substrate 101, and the dielectric layer 330 is disposed on the first conductor 310. The multilayered blocking layer 340 is disposed on the dielectric layer 330. The multilayered blocking layer 340 has more than one blocking film. In the instant embodiment, the multilayered blocking layer 340 includes a first blocking film 341 and a second blocking film 342. A material of the blocking films may be tantalum, tantalum nitride, titanium nitride or the like. It should be understood that the first and second blocking films 341, 342 can be made of different materials. In addition, the number of blocking films is not limited to two as shown in FIG. 3. The blocking layer 340 may include four, seven or more of the blocking films according to desired purpose. The second conductor 350 is disposed on the second blocking film 342. It has been discussed previously that Ta, TaN or TiN exhibits better ability in delaying copper diffusion, and therefore the employment of these materials and the multilayered structure as blocking layer 340 can effectively minimize copper contamination when performing metal layer etching.

In some embodiments, a plurality of first blocking films is disposed on the dielectric layer 330. The first blocking films are made of TiN. A plurality of second blocking films, which is made of TaN is disposed on the first blocking films, and the second conductor 350 is disposed on the second blocking films. The second blocking films have a collective thickness no less than 5 angstrom (Å). The arrangement is due to electrical property of TiN and TaN. TiN has less influence on the dielectric layer 330, while TaN shows better copper delaying than TiN as shown in Table 1. In this regard, copper particles are blocked by the first and second blocking films. Even if pinholes or grain boundaries are formed, the multilayered blocking layer 340 inhibits further defect growth because of its thin profile and being a multiple interfaced block where adverse activity will be interrupted.

Figure 4:
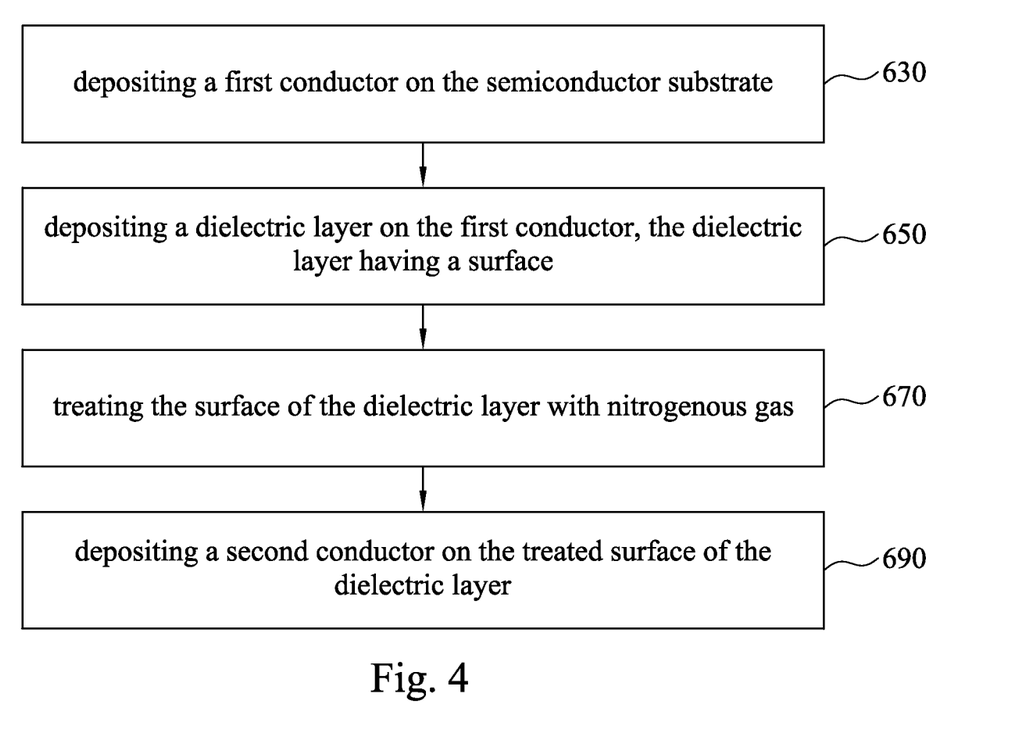
FIG. 4 is a flow chart showing a method of fabricating a nitrogenous gas treated metal-insulator-metal capacitor in accordance with some embodiments of the instant disclosure.

The instant disclosure also provides a method of making capacitor structure. FIG. 4 and the corresponding description are directed to a flow chart showing steps of fabricating a nitrogenous capacitor, and it is not meant to be interpreted or construed as limiting the aspects of the instant disclosure described herein. Firstly, a semiconductor substrate is provided. Next, a first conductor is deposited on the semiconductor substrate. Then a dielectric layer is deposited on the first conductor. The dielectric layer has a surface opposite to the interface with the first conductor. The surface of the dielectric layer is treated with nitrogenous gas. Finally, a second conductor is deposited on the treated surface of the dielectric layer.

Attention is now invited to FIGS. 5A to 5E showing a method of fabricating a nitrogenous gas treated metal-insulator-metal capacitor in accordance with some embodiments of the instant disclosure. The MIM capacitor can be deployed in different applications, and the description hereinafter focuses on the construction of the key capacitor elements. A person of ordinary skill in the art should understand the capacitor may require further processing so as to properly incorporate with the device.

Figure 5A:
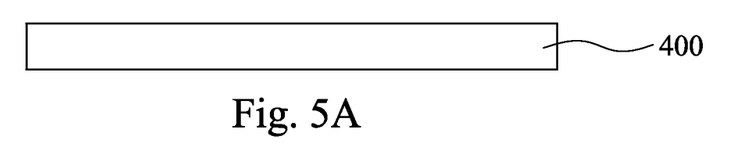
FIGS. 5A to 5E are a method of fabricating a nitrogenous gas treated metal-insulator-metal capacitor in accordance with some embodiments of the instant disclosure.
Figure 5B:
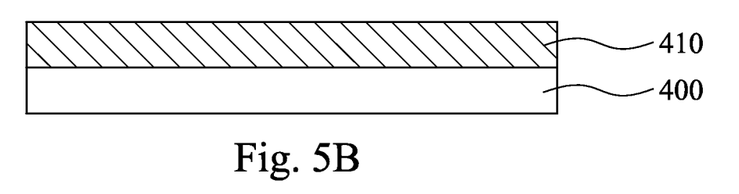
Figure 5C:
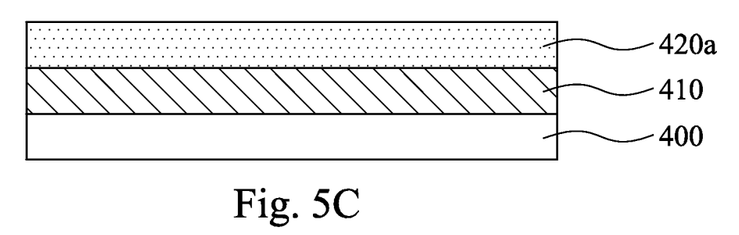
Figure 5D:
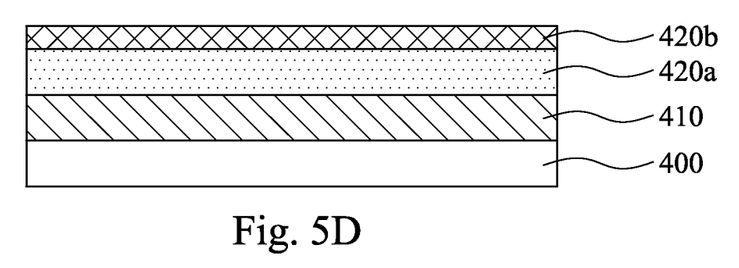
Figure 5E:
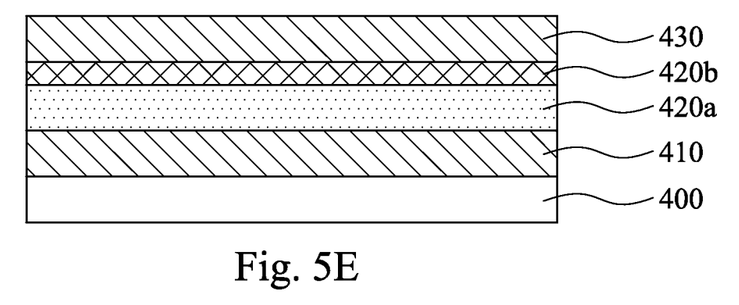

As shown in FIG. 5A, a semiconductor substrate 400 is provided. The semiconductor substrate 400 is partially complete and can be a portion of, for example, MODFET or MESFETs. In the instant embodiment, the substrate 400 is silicon carbine having an undoped silicate glass layer. Next, as shown in FIG. 5B, the first conductor 410 is deposited on the semiconductor substrate 400. The first conductor 410 may be deposited by various deposition techniques, such as thermal decomposition, chemical vapor deposition (CVD), pulsed-chemical vapor deposition, plasma enhanced chemical vapor deposition (PE-CVD), remote plasma enhanced chemical vapor deposition, atomic layer deposition (ALD), plasma enhanced atomic layer deposition (PE-ALD), physical vapor deposition (PVD) or combination thereof. Attention is now invited to FIG. 5C. Followed by the deposition of the first conductor 410, a dielectric layer 420a is deposited on the first conductor 410 by, for example, physical vapor deposition. The dielectric layer 420a is subsequently treated by nitrogenous gas. The nitrogenous gas treatment results in the formation of a thin nitrogenous film 420b on the dielectric layer 420a in FIG. 5D. In addition, nitrogenous particles permeate through the surface of the dielectric layer 420a and invade a thickness of less than 5 angstroms (Å) of the dielectric layer 420a. Consequently, the dielectric layer is converted into a nitrogenous dielectric layer including the dielectric layer 420a and the thin nitrogenous film 420b. Finally, a second conductor 430 is deposited on the nitrogenous treated dielectric layer as shown in FIG. 5E.

By treating the dielectric layer 420a with nitrogenous gas including nitrogen ($N_2$), hydrogen nitride (ammonia, $NH_3$), nitrous oxide ($N_2O$) or the like, the capacitor shows greater resistance against copper diffusion because the thin nitrogenous film 420b not only coats the dielectric layer 420a but also occupies a portion of the dielectric layer 420a so as to extend its function of protection. The interface nitridation prevents fast copper diffusion. This blockage effect is important because the aggregation of copper atoms at the cathode of the metal will lead to copper ionization whose accumulative effect is electrical current increase. The elevated current resulting from copper particles leads to a decreased breakdown voltage that will cause problematic situation in the device manufacturing.

Figure 6A:
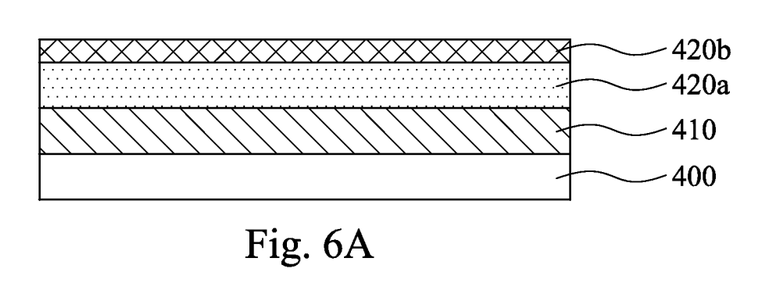
FIGS. 6A to 6F are a method of fabricating a nitrogenous gas treated metal-insulator-metal capacitor having a plurality of blocking films in accordance with some embodiments of the instant disclosure.
Figure 6B:
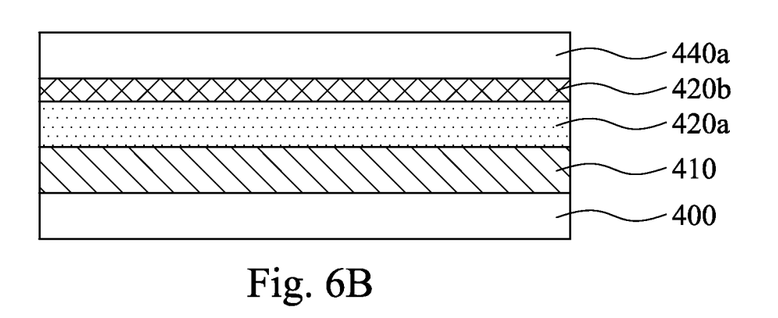
Figure 6C:
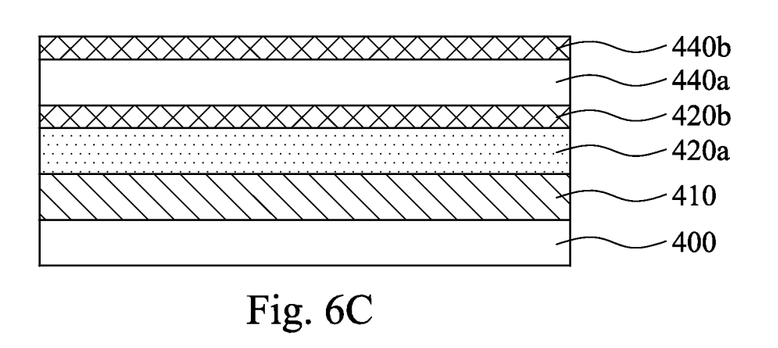
Figure 6D:
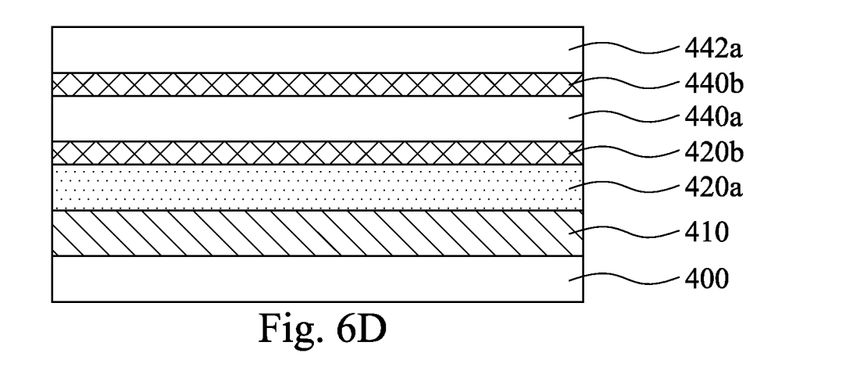
Figure 6E:
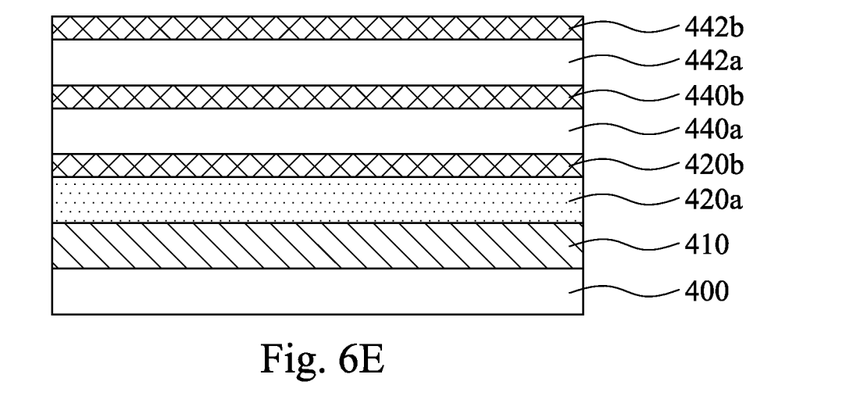
Figure 6F:
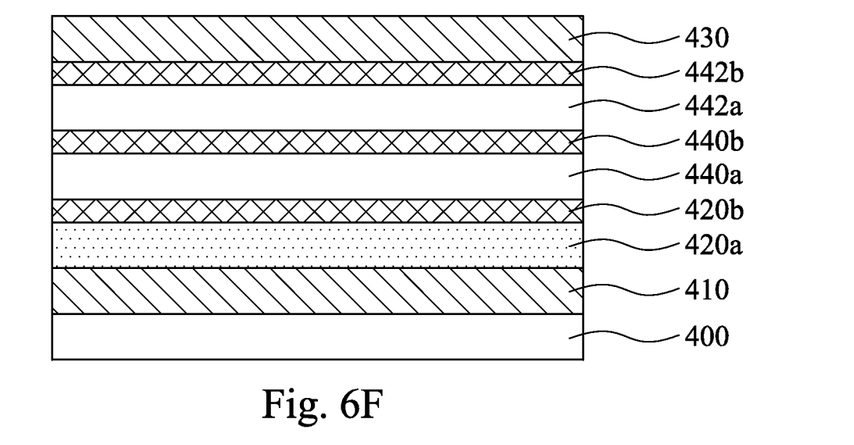

FIGS. 6A to 6F are a method of fabricating a nitrogenous gas treated metal-insulator-metal capacitor having blocking films in accordance with some embodiments of the instant disclosure. FIG. 6A starts from the intermediate shown in FIG. 5D, and the fabrication of the foundation is the same. Attention is now invited to FIG. 6B. After the surface of the dielectric layer 420a is treated by nitrogenous gas and the thin nitrogenous gas film 420b is formed thereon, a first blocking film 440a is deposited on the treated surface of the dielectric layer 420a. The first blocking film 420a is deposited by, for example, physical vapor deposition. A material of the first blocking film 440a may be tantalum, tantalum nitride, titanium nitride or the like. In addition to the deposition of a blocking film, the first blocking film 440a is treated by nitrogenous gas to form a thin nitrogenous film 440b thereon, as shown in FIG. 6C. Followed by the nitrogenous gas treatment, a second blocking film 442a is deposited by, for example, physical vapor deposition as shown in FIG. 6D. The second blocking film 442a may be made of the same material as the first blocking film 440a or different therefrom. Likewise, in FIG. 6E, the second blocking film 442a is treated by nitrogenous gas so as to form a thin nitrogenous film 442b thereon. Finally, as shown in FIG. 6F, a second conductor 430 is deposited over the nitrogenous gas treated second blocking film 442b.

The first and second blocking films 440a, 442a along with the thin nitrogenous films 440b and 442b enhance the ability of blocking copper diffusion. As shown in FIGS. 6A to 6F, the multiple deposition is the key in the method. To begin with, when depositing blocking films layer by layer instead of a bulky block, pinhole or grain boundary is less likely to form because each of the blocking films has a relatively thin profile. Secondly, even if a pinhole or grain boundary is formed, the development is interrupted due to the discrete formation process, i.e., depositing one layer after another. Thirdly, the nitrogenous gas treated blocking films can effectively slow down the rate of copper diffusion such that a window is created to allow other steps to take place before copper contamination. Overall, copper-induced voltage breakdown is less likely to happen in the multi-step deposition process.

It should be understood that the number of blocking films is not limited to the previously described embodiment. That is to say, there may be one, three, eight or more blocking films deposited on the treated surface of the dielectric layer 420b. The interface nitridation treatment is also optional to each of the blocking films. For example, the first blocking film 440a may be deposited without nitrogenous gas treatment. The interface nitridation is a method to further prevent copper diffusion, yet it should be appreciated that the blocking films alone exhibit the same function to a different extent as well.

In some embodiments, the material and arrangement of the blocking films is more specific. For example, a plurality of first blocking films, which are made of titanium nitride, is formed on the nitrogenous gas treated surface of the dielectric layer 420b by, for example, physical vapor deposition. Next, a plurality of second blocking films, which are made of titanium nitride, is formed on the plurality of the first blocking films. The second blocking films have a collective thickness no less than 5 angstrom (Å). Each of the first and second blocking films may be respectively treated by nitrogenous gas. Attention is now invited to FIG. 6E, which shows similar multiple deposition of the resulting product. The arrangement of titanium nitride and then tantalum nitride has its significance in electrical property performance. More specifically, titanium nitride shows the least electrically adverse influence on the dielectric layer so as to maintain normal dielectric layer operation. On the other hand, as shown in Table 1, tantalum nitride shows a more persistent resistance to copper diffusion. The time of copper diffusion can be dragged to as long as 20000 seconds for a 25 nm thick dielectric layer. In the case of a dielectric layer having a thickness of about 7 nm, the copper diffusion time will still be relatively slow to approximately 540 seconds. The delayed diffusion can allow sufficient time to other procedure to take place before copper contamination.

The instant disclosure provides the capacitor structure having nitrogenous dielectric layer. Nitrogenous gas permeates into a portion of the nitrogenous dielectric layer and forms a thin film thereon so as to protect the dielectric layer from fast copper diffusion which can result in low breakdown voltage in an early stage. In addition to the nitrogenous dielectric layer, the addition of the blocking layer further enhances the capacitor ability against copper particle disruption. The blocking layer contains multiple layers of blocking films. Because of its multilayered structure, copper induced pinhole or grain boundary is less likely to form because the thin profile of each of the blocking films. Furthermore, each of the blocking films may be treated by nitrogenous gas such that the capacitor is thoroughly protected from fast copper diffusion in the presence of both nitrogenous films and blocking films. The blocking films alone without nitrogenous gas can also effectively inhibit copper particle invasion. The instant disclosure also provides a method of making the capacitor structure. The first conductor is disposed on a partially complete semiconductor substrate, and then the dielectric layer is deposited. The dielectric layer is later treated by nitrogenous gas, and a thin nitrogenous film is formed over the dielectric layer, and at the same time a portion of the dielectric layer contains small amount of nitrogenous gas. The interface nitridation can prevent fast copper diffusion upon etching. Moreover, the blocking films are deposited layer by layer on the treated dielectric layer. The multiple deposition effectively prevents pinhole or grain boundary development because of its thin profile in each film and discrete formation process. The degree of copper contamination is minimized in the presence of nitrogenous dielectric layer or the blocking films, and the multiple deposition and discrete blocking film formation further inhibit accumulative electrical defect like voltage breakdown.

In some embodiments in accordance with the instant disclosure, a structure is provided. The structure includes a semiconductor substrate and a conductor-insulator-conductor capacitor disposed on the semiconductor substrate. The conductor-insulator-conductor capacitor includes a first conductor, a nitrogenous dielectric layer disposed on the first conductor and a second conductor disposed on the nitrogenous dielectric layer.

In some embodiments in accordance with the instant disclosure, a structure is provided. The structure includes a semiconductor substrate and a conductor-insulator-conductor capacitor disposed thereon. The conductor-insulator-conductor capacitor includes a first conductor, a dielectric layer disposed on the first conductor, a multilayered blocking layer disposed on the dielectric layer and a second conductor disposed on the blocking layer.

In some embodiments in accordance with the instant disclosure, a method is provided. The method includes providing a semiconductor substrate. Then a first conductor is deposited on the semiconductor substrate. Subsequently, a dielectric layer is deposited on the first conductor. The dielectric layer has a surface, and the surface is treated by nitrogenous gas. Finally, a second conductor is deposited on the treated surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a metal-insulator-metal capacitor comprising:
    depositing a first conductor over a semiconductor substrate;
    depositing a first dielectric layer over the first conductor, the first dielectric layer having a surface, wherein the first dielectric layer does not contain tantalum;
    treating the surface of the first dielectric layer with nitrogenous gas to permeate nitrogenous particles of the nitrogenous gas into the first dielectric layer and to form a nitrogenous film over the surface of the first dielectric layer;
    depositing a second conductor over the nitrogenous film;
    depositing a second dielectric layer over the second conductor and the first dielectric layer; and
    forming a via hole in the second dielectric layer and through the first dielectric layer to expose the first conductor.

2. The method according to claim 1, further comprising:
    depositing a blocking film over the nitrogenous film, wherein:
        the blocking film is made of tantalum (Ta), tantalum nitride (TaN), or titanium nitride (TiN), and
        depositing the second conductor comprises depositing the second conductor over the blocking film.

3. The method according to claim 1, further comprising:
    forming a plurality of blocking films over the nitrogenous film, wherein depositing the second conductor comprises depositing the second conductor over the plurality of blocking films.

4. The method according to claim 3, wherein each of the plurality of blocking films is made of tantalum, tantalum nitride or titanium nitride.

5. The method according to claim 3, further comprising:
    treating each of the plurality of blocking films with nitrogenous gas.

6. The method according to claim 3, wherein:
    an uppermost blocking film of the plurality of blocking films is made of tantalum nitride, and
    depositing the second conductor comprises depositing the second conductor to contact the uppermost blocking film.

7. The method according to claim 1, further comprising:
    forming a plurality of first blocking films on the nitrogenous film; and
    forming a plurality of second blocking films over the plurality of first blocking films, wherein the plurality of first blocking films are made of titanium nitride and the plurality of second blocking films are made of tantalum nitride.

8. The method according to claim 7, further comprising:
    treating each of the plurality of first blocking films and each of the plurality of second blocking films with nitrogenous gas.

9. The method according to claim 7, wherein the plurality of second blocking films have a thickness larger than 5 angstrom.

10. The method according to claim 1, wherein the nitrogenous gas comprises a gas form of nitrogen ($N_2$), ammonia ($NH_3$), or nitrous oxide ($N_2O$).

11. The method according to claim 1, further comprising:
    forming a first blocking film of a plurality of first blocking films over the nitrogenous film;
    forming a first blocking film of a plurality of second blocking films over the first blocking film of the plurality of the first blocking films;
    forming a second blocking film of the plurality of first blocking films over the first blocking film of the plurality of second blocking films; and
    forming a second blocking film of the plurality of second blocking films over the second blocking film of the plurality of first blocking films.

12. The method according to claim 11, wherein the plurality of first blocking films are made of titanium nitride and the plurality of second blocking films are made of tantalum nitride.

13. The method according to claim 11, further comprising:
treating each of the plurality of first blocking films and the plurality of second blocking films with nitrogenous gas.

14. The method according to claim 1, wherein:
depositing the first conductor comprises depositing the first conductor such that the first conductor is in contact with the semiconductor substrate and such that the entire first conductor is made of the same material, and
depositing the first dielectric layer comprises depositing the first dielectric layer such that the first dielectric layer is in contact with the first conductor.

15. The method according to claim 1, wherein depositing the second dielectric layer comprises depositing the second dielectric layer to contact a sidewall of the nitrogenous film and a sidewall of the first dielectric layer.

16. The method according to claim 15, wherein depositing the second dielectric layer comprises depositing the second dielectric layer to contact a top surface of the second conductor and a top surface of the first dielectric layer.

17. The method according to claim 1, wherein the first dielectric layer comprises at least one of hafnium oxide, aluminium oxide, zirconium oxide, hafnium silicate, hafnium silicon oxynitride, lanthanum oxide, lanthanum silicate, or zirconium zilicate.

18. A method of a fabricating metal-insulator-metal capacitor comprising:
depositing a first conductor over a semiconductor substrate;
depositing a first dielectric layer over the first conductor, the first dielectric layer having a surface;
treating the surface of the first dielectric layer with nitrogenous gas to permeate nitrogenous particles of the nitrogenous gas into the first dielectric layer and to form a nitrogenous film over the surface of the first dielectric layer;
forming a first blocking film over the nitrogenous film and contacting the nitrogenous film, wherein the first blocking film comprises titanium nitride;
forming a second blocking film over the first blocking film, wherein the second blocking film comprises tantalum nitride;
depositing a second conductor over the second blocking film;
depositing a second dielectric layer over the second conductor and the first dielectric layer; and
forming a first via hole to expose the first conductor and a second via hole to expose the second conductor, wherein the first via hole goes through the second dielectric layer and the first dielectric layer and the second via hole goes through the second dielectric layer.

19. The method according to claim 18, wherein the second conductor contacts the second blocking film.

20. A method of fabricating a metal-insulator-metal capacitor comprising:
depositing a first conductor over a semiconductor substrate;
depositing a first dielectric layer over the first conductor, the first dielectric layer having a surface;
treating the surface of the first dielectric layer with nitrogenous gas to permeate nitrogenous particles of the nitrogenous gas into the first dielectric layer to a depth of no more than 5 Angstroms below the surface of the first dielectric layer and to form a nitrogenous film over the surface of the first dielectric layer;
depositing a second conductor over the nitrogenous film;
depositing a second dielectric layer over the first dielectric layer, wherein depositing the second dielectric layer comprises:
disposing a silicon oxynitride layer over the second conductor, and
disposing a silicon nitride layer over the silicon oxynitride layer; and
forming a via hole in the second dielectric layer and through the first dielectric layer to expose the first conductor.

* * * * *